United States Patent [19]
Hara et al.

[11] Patent Number: 5,434,517
[45] Date of Patent: Jul. 18, 1995

[54] ECL OUTPUT BUFFER WITH A MOS TRANSISTOR USED FOR TRISTATE ENABLE

[75] Inventors: Hiroyuki Hara, Fujisawa; Takayasu Sakurai, Tokyo, both of Japan

[73] Assignee: Kabushiki Kaisha Toshiba, Kawasaki, Japan

[21] Appl. No.: 215,174

[22] Filed: Mar. 21, 1994

[30] Foreign Application Priority Data

Jun. 8, 1993 [JP] Japan ................. 5-137384

[51] Int. Cl.6 ......................................... H03K 19/086
[52] U.S. Cl. ......................................... 326/57; 326/84; 326/109
[58] Field of Search ............... 307/473, 446, 455, 475, 307/443; 326/57, 84, 109

[56] References Cited

U.S. PATENT DOCUMENTS

| | | | |
|---|---|---|---|
| 4,678,943 | 7/1987 | Uragami et al. | 307/446 |
| 4,980,579 | 12/1990 | McDonald et al. | 307/473 |
| 4,999,519 | 3/1991 | Kitsukawa et al. | 307/443 |
| 5,101,123 | 3/1992 | Ten Eyck | 307/475 |
| 5,172,015 | 12/1992 | Barre | 307/446 |
| 5,300,832 | 4/1994 | Rogers | 307/473 |

Primary Examiner—Edward P. Westin
Assistant Examiner—Benjamin D. Driscoll
Attorney, Agent, or Firm—Spensley Horn Jubas & Lubitz

[57] ABSTRACT

An ECL output buffer circuit is constituted by an output buffer circuit main portion and its control circuit. In the output buffer circuit main portion, an output from a differential switch is input to the base of a bipolar transistor (emitter follower). The emitter of the bipolar transistor is connected to an output terminal. A ground potential is applied to the collector of the bipolar transistor. One end of the channel conductive path of a MOS transistor is connected to the base of the bipolar transistor. The other end of the channel conductive path is connected to a power-supply terminal via a constant-current source. The control circuit controls the ON/OFF operation of the MOS transistor and the output level of the bipolar transistor. When the output buffer circuit main portion is to be set in a standby state, the control circuit performs control to set the MOS transistor in an ON state and set the output of the bipolar transistor at low level.

9 Claims, 3 Drawing Sheets

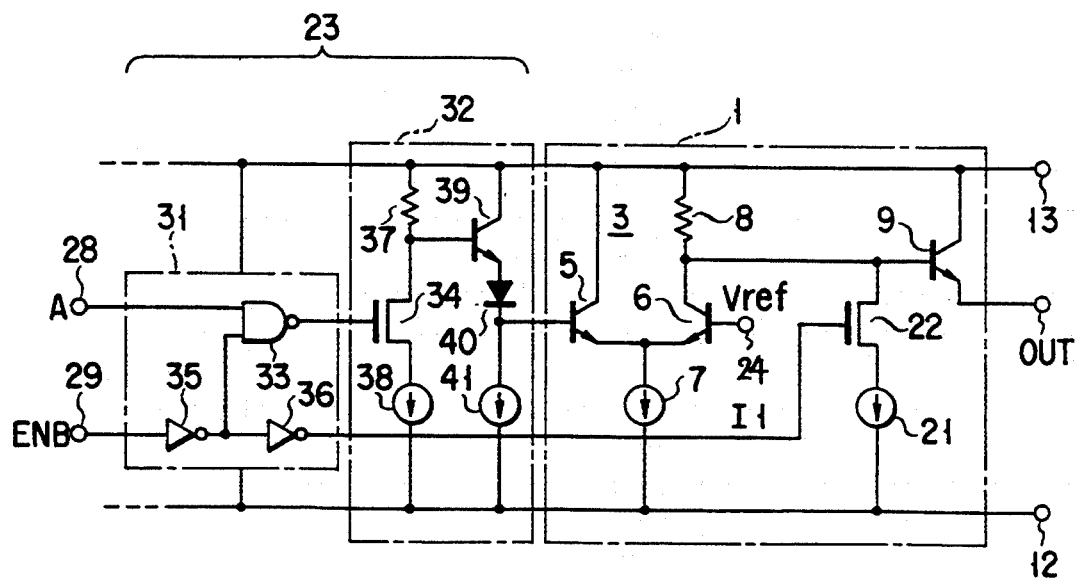
F I G. 4
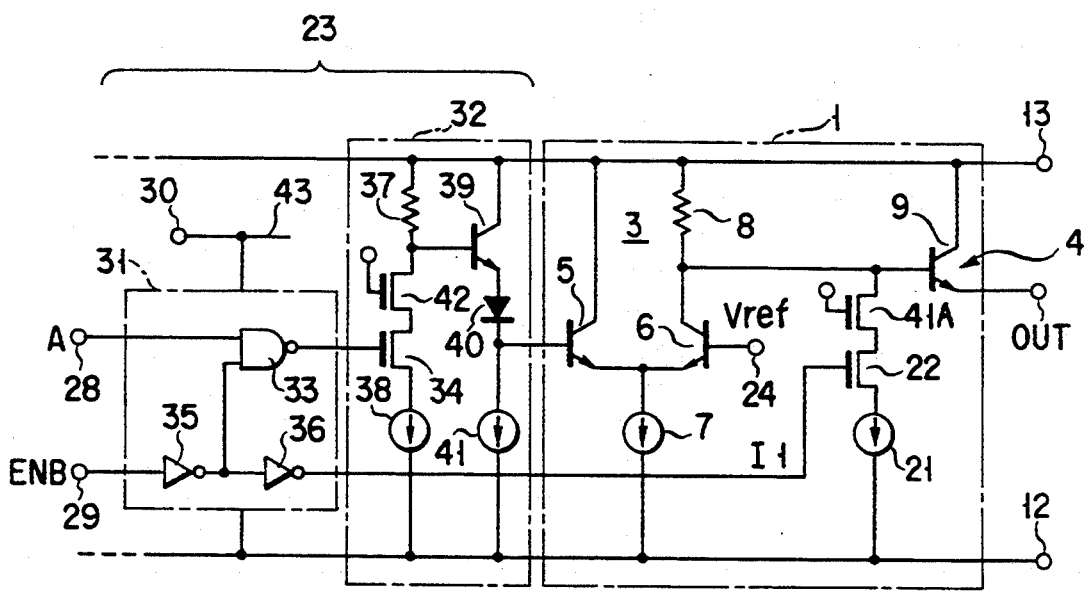
F I G. 5

ECL OUTPUT BUFFER WITH A MOS TRANSISTOR USED FOR TRISTATE ENABLE

BACKGROUND OF THE INVENTION

1. Field of the Invention

The present invention relates to an improvement in a plurality of ECL (emitter-coupled logic) output buffer circuits connected in parallel with each other to one bus.

2. Description of the Related Art

FIG. 1 shows a conventional bus structure.

In this bus structure, a plurality of ECL output buffer circuits 1A to 1C and one or more ECL input buffer circuits 2 are connected in parallel with each other to one bus.

In the ECL output buffer circuits 1A to 1C, reference numeral 3 denotes a differential switch constituting an ECL output buffer circuit main portion; and 4, an emitter follower.

The base of an npn bipolar transistor 5 is connected to an input terminal IN. The base of an npn bipolar transistor 6 is connected to a terminal 24. A reference potential Vref is applied to the terminal 24. The emitters of both the transistors 5 and 6 are connected to a power-supply terminal 12 via a constant-current source 7. For example, a potential of −4.5 V is applied to the power-supply terminal 12.

The collector of the transistor 5 is connected to a power-supply terminal 13. For example, a ground potential (0 V) is applied to the power-supply terminal 13. The collector of the transistor 6 is connected to the power-supply terminal 13 via a resistor 8. The base of an npn bipolar transistor 9 constituting the emitter follower 4 is connected to the collector of the transistor 6. The collector of the transistor 9 is connected to the power-supply terminal 13. The emitter of the transistor 9 is connected to a bus BUS.

The bus BUS is connected to a terminating power-supply terminal 11 via a load resistor (e.g., 50 Ω) 10. For example, a potential of −2 V is applied to the terminating power-supply terminal 11.

In the ECL input buffer circuit 2, reference numeral 18 denotes an npn bipolar transistor; 19, a resistor; and 20, a differential switch.

The base of an npn bipolar transistor 14 is connected to the bus BUS. The base of an npn bipolar transistor 15 is connected to a terminal 25. The reference potential Vref is applied to the terminal 25. The emitters of both the transistors 14 and 15 are connected to a power-supply terminal 26 via a constant-current source 16. For example, a potential of −4.5 V is applied to the power-supply terminal 26.

The collector of the transistor 14 is connected to a power-supply terminal 27. For example, a ground potential (0 V) is applied to the power-supply terminal 27. The collector of the transistor 15 is connected to the power-supply terminal 27 via a resistor 17. The base of the bipolar transistor 18 constituting an emitter follower is connected to the collector of the transistor 15. The collector of the transistor 18 is connected to the power-supply terminal 27. The emitter of the transistor 18 is connected to the power-supply terminal 26 via the resistor 19.

In the above-described bus structure, the output portions of the ECL output buffer circuits 1A to 1C respectively constitute emitter followers. That is, the bus structure is a wired-OR structure. Note that in the wired-OR structure, when at least one of output signals from the plurality of ECL output buffer circuits connected in parallel with each other to the bus BUS is set at "H (high)" level, the bus BUS is set at "H" level.

When, therefore, a signal is to be exchanged between one ECL output buffer circuit and one ECL input buffer circuit, output signals from the remaining ECL output buffer circuits connected to the bus BUS may be set at "L (low)" level.

Assume that in FIG. 1, the ECL output buffer circuit 1C is to transmit a signal, and the ECL input buffer circuit 2 is to receive the signal. In this case, when output signals from the ECL output buffer circuits 1A and 1B are set at "L" level to set the circuits in a standby state, the output signal ("H" or "L" level) from the ECL output buffer circuit 1C is transmitted to the ECL input buffer circuit 2 via the bus BUS.

In the above-described bus structure, however, currents flow not only from the ECL output buffer circuit which is to transmit a signal but also from the ECL output buffer circuits in a standby state, which are to transmit no signals, to the terminating power-supply terminal 11 via the load resistor 10.

For this reason, as the number of ECL output buffer circuits connected to the bus BUS increases, a current flowing from the ECL output buffer circuit, which is to transmit a signal, to the load resistor 10 decreases, and a base-emitter voltage VBE of the bipolar transistor (emitter follower) of the ECL output buffer circuit which is to transmit the signal decreases. As a result, the "L"-level signal output from the ECL output buffer circuit to the bus BUS is increased in signal level.

This increase in signal level reduces the margin of "L" level detection of the ECL input buffer circuit. In addition, since the "L" level detection margin of the ECL input buffer circuit is generally as low as about 0.8 V, an erroneous operation of the ECL input buffer circuit tends to occur.

That is, in order to prevent an erroneous operation of the ECL input buffer circuit, the number of ECL output buffer circuits connected to the bus cannot be increased.

SUMMARY OF THE INVENTION

The present invention has been made in consideration of the above situation, and has as its object to provide an ECL output buffer circuit which is designed not to reduce the signal detection margin of an ECL input buffer circuit even if a large number of identical ECL output buffer circuits are connected in parallel with each other to one bus.

In order to achieve the above object, according to the present invention, there is provided an ECL output buffer circuit comprising an output buffer circuit main portion and a control circuit.

The output buffer circuit main portion is constituted by a differential switch, a first bipolar transistor constituting an emitter follower and having a base to which an output from the differential switch is input, a collector connected to a first power-supply terminal, and an emitter connected to an output terminal, and a first MOS transistor including a channel conductive path having one end connected to the base of the first bipolar transistor, and the other end connected to a second power-supply terminal via a first constant-current source.

The control circuit outputs a first output signal to be input to a gate of the first MOS transistor, and a second output signal to be input to the differential switch of the output buffer circuit main portion. In addition, when the output buffer circuit main portion is to be set in a standby state, the control circuit outputs a first output signal for setting the first MOS transistor in an ON state, and a second output signal for setting an output from the first bipolar transistor at low level, thereby setting the output from the first bipolar transistor in a cutoff state. When the output buffer circuit main portion is to be set in a normal operation state, the control circuit outputs a first output signal for setting the first MOS transistor in an OFF state, and a second output signal for setting an output from the first bipolar transistor at low or high level.

The ECL output buffer circuit of the present invention has the following characteristic features.

The differential switch comprises a second bipolar transistor having a base to which the second output signal is input, a collector connected to the first power-supply terminal, and an emitter connected to the second power-supply terminal via a second constant-current source, and a third bipolar transistor having a base to which a reference potential is input, a collector connected to the first power-supply terminal via a first resistor, and an emitter connected to the second power-supply terminal via the second constant-current source, and an output from the differential switch is obtained from the collector of the third bipolar transistor.

The control circuit comprises a CMOS logic portion and a CMOS-ECL level converting portion.

The CMOS logic portion is connected between the first and second power-supply terminals and outputs a first output signal to be input to the gate of the first MOS transistor, and a third output signal to be input to the CMOS-ECL level converting portion.

The CMOS-ECL level converting portion comprises a second MOS transistor having a gate to which the third output signal is input, a channel conductive path having one end connected to the first power-supply terminal via a second resistor, and the other end connected to the second power-supply terminal via a third constant-current source, and a fourth bipolar transistor having a base connected to a node between the second resistor and the second MOS transistor, a collector connected to the first power-supply terminal, and an emitter connected to the second power-supply terminal via a diode and a fourth constant-current source.

An output from the CMOS-ECL level converting portion is obtained from a node between the diode and the fourth constant-current source.

The CMOS logic portion comprises a first inverter for receiving a third input signal for determining whether the output buffer circuit main portion is set in a normal operation state or a standby state, a NAND gate for receiving a fourth input signal for determining an output level of the first bipolar transistor and an output signal from the first inverter, and outputting the third output signal, when the output buffer circuit main portion is in a normal operation state, and a second inverter for receiving an output signal from the first inverter and outputting the first output signal.

With this arrangement, while the ECL output buffer circuit is in a standby state, in which no signal is transmitted, the ECL output buffer circuit can output a potential having a level lower than that in a normal operation state owing to the first MOS transistor. Therefore, the number of ECL output buffer circuits connected to one bus can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing the details of the ECL output buffer circuit in FIG. 3; and FIG. 5 is a circuit diagram showing an ECL output buffer circuit according to the second embodiment of the present invention.

DETAILED DESCRIPTION OF THE PREFERRED EMBODIMENTS

ECL output buffer circuits according to the present invention will be described in detail below with reference to the accompanying drawings.

Figure 1:
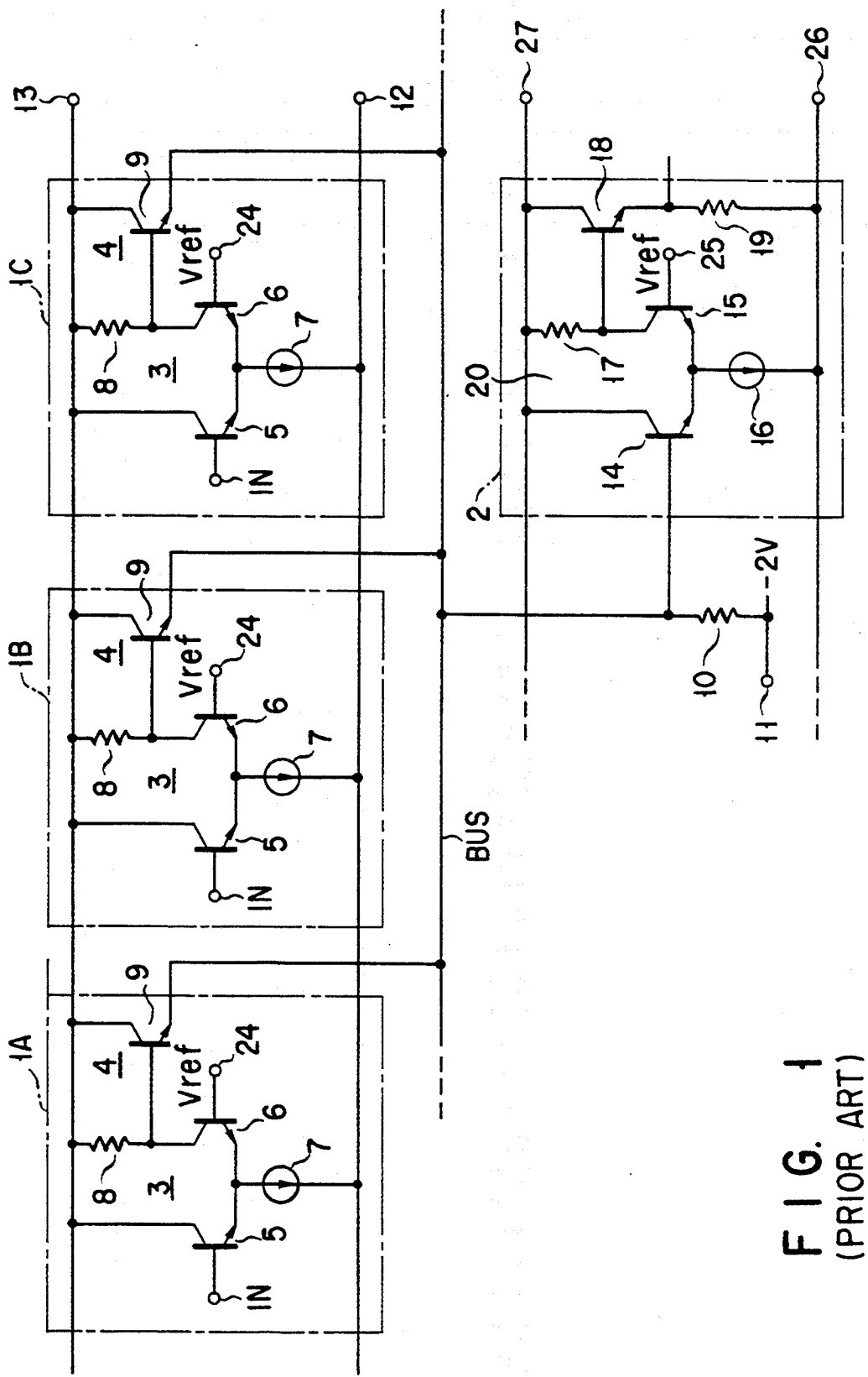
FIG. 1 is a circuit diagram showing conventional ECL output buffer circuits.
Figure 2:
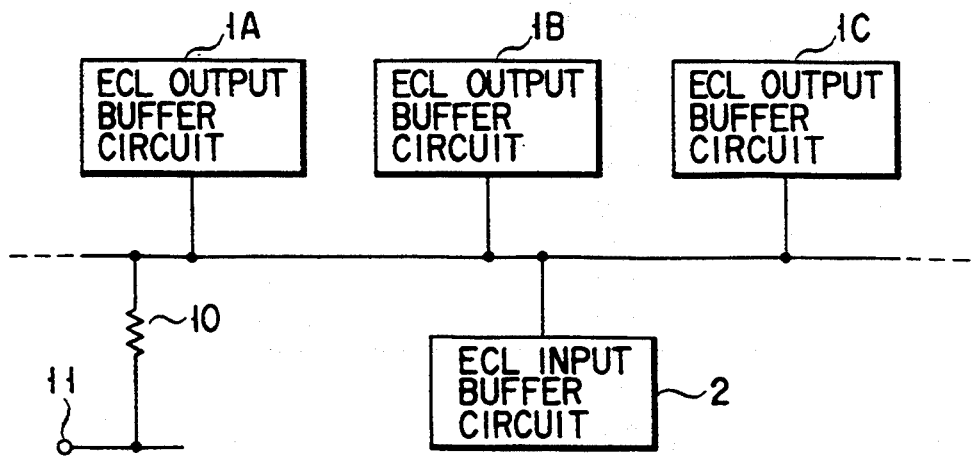
FIG. 2 is a block diagram showing a bus structure having ECL output buffer circuits according to the present invention.

FIG. 2 shows a bus structure having ECL output buffer circuits according to the present invention. In the bus structure shown in FIG. 2, a plurality of ECL output buffer circuits 1A to 1C and one ECL input buffer circuit 2 are connected in parallel with each other to one bus.

Figure 3:
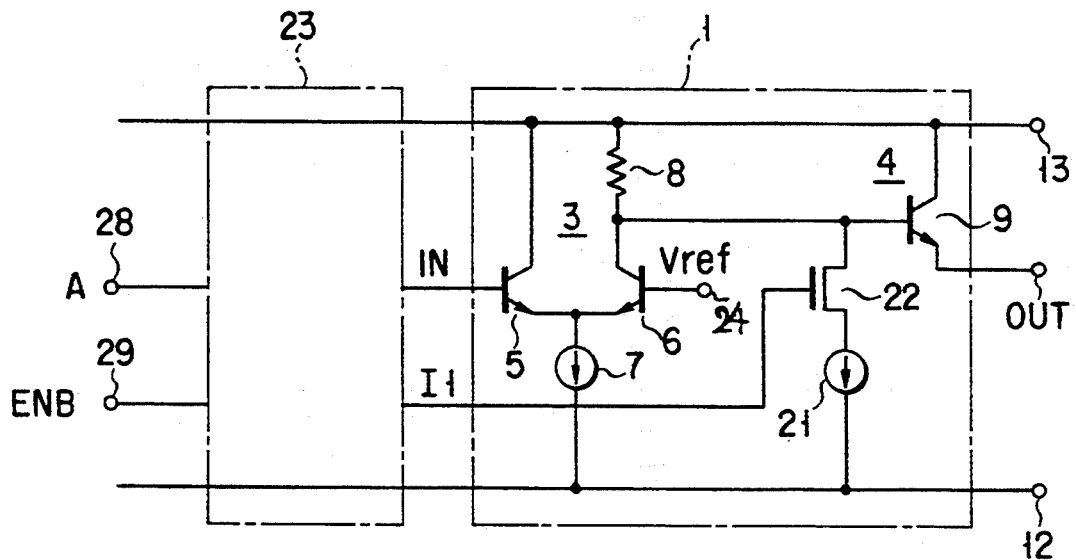
FIG. 3 is a circuit diagram showing an ECL output buffer circuit according to the first embodiment of the present invention.

FIG. 3 is a circuit diagram showing one of the ECL output buffer circuits in FIG. 2.

The arrangement of each ECL output buffer circuit of the present invention will be described below.

Reference numeral 3 denotes a differential switch constituting the ECL output buffer circuit main portion; and 4, an emitter follower.

The base of an npn bipolar transistor 5 is connected to an input terminal IN. The base of an npn bipolar transistor 6 is connected to a terminal 24. A reference potential Vref is applied to the terminal 24. The emitters of transistors 5 and 6 are connected to a power-supply terminal 12 via a constant-current source 7. A potential of $-4.5$ V is applied to the power-supply terminal 12.

The collector of the transistor 5 is connected to a power-supply terminal 13. For example, a ground potential (0 V) is applied to the power-supply terminal 13. The collector of the transistor 6 is connected to the power-supply terminal 13 via a resistor 8. The base of an npn bipolar transistor 9 constituting the emitter follower 4 is connected to the collector of the transistor 6. The collector of the transistor 9 is connected to the collector of the transistor 6. The collector of the transistor 9 is connected to the power-supply terminal 13. The emitter of the transistor 9 is connected to an output terminal OUT.

The base of the transistor 9 is connected to the drain of a MOS transistor 22. The source of the MOS transistor 22 is connected to the power-supply terminal 12 via a constant-current source 21. The base of the bipolar transistor 5 and the gate of the MOS transistor 22 are connected to a control circuit 23.

The ECL output buffer circuit in FIG. 3 has the following characteristic features. First, the drain of the MOS transistor 22 is connected to the base of the bipolar transistor 9 of the emitter follower 4, and the source of the transistor 22 is connected to the power-supply terminal 12 via the constant-current source 21. Second, the operation of the MOS transistor is controlled by the control circuit 23.

More specifically, an output I1 from the control circuit 23 is input to the gate of the MOS transistor 22, and an output IN from the control circuit 23 becomes a differential input to an output buffer circuit main portion 1. An enable signal ENB is input to an input terminal 29 of the control circuit 23. When an output signal from the emitter follower 4 of the output buffer circuit main portion 1 is to be set in a cutoff state, i.e., the ECL output buffer circuit is to be set in a standby state, the level of the output I1 changes to render the MOS transistor 22 conductive, and the output IN changes an output signal OUT from the emitter follower 4 to an output signal having a level lower than "L" level.

An input signal ENB for setting the ECL output buffer circuit in a cutoff state is input to the terminal 29 of the control circuit 23. In addition, an input signal A, on which the input signal IN to the output buffer circuit main portion 1 is based, is input to a terminal 28.

FIG. 4 is a circuit diagram showing the ECL output buffer circuit in FIG. 3 in more detail.

The control circuit 23 is constituted by a CMOS logic portion 31 connected between the two power-supply terminals 12 and 13, and a level converting portion 32 for performing CMOS-ECL level conversion.

The arrangement of the logic portion 31 will be described below.

The first input terminal of a CMOS NAND gate 33 is connected to the terminal 28 to which the input signal A is supplied. The output terminal of the NAND gate 33 is connected to the gate of an n-channel MOS transistor 34 of the level converting portion 32. The input terminal of a CMOS inverter 35 is connected to the terminal 29 to which the input signal ENB is supplied.

The output terminal of the inverter 35 is connected to the second input terminal of the NAND gate 33 and the input terminal of a CMOS inverter 36. The output terminal of the inverter 36 is connected to the gate of the MOS transistor 22.

The arrangement of the level converting portion 32 will be described below.

One terminal (source/drain) of the MOS transistor 34 is connected to the ground power supply 13. The other terminal (source/drain) of the MOS transistor 34 is connected to the power-supply terminal 12 via a constant-current source 38. The node between the resistor 37 and the transistor 34 is connected to the base of an npn bipolar transistor 39. The collector of the transistor 39 is connected to the ground terminal 13. The emitter of the transistor 39 is connected to the power-supply terminal 12 via a diode 40 and a constant-current source 41. The node between the diode 40 and the constant-current source 41 is connected to the base of the transistor 5 of the output buffer circuit main portion 1.

As shown in FIG. 2, the output terminal OUT of the above-described ECL output buffer circuit is connected to a bus BUS. A terminating power-supply terminal 11 is also connected to the bus BUS via a load resistor 10.

The operation of the ECL output buffer circuit shown in FIGS. 2 to 4 will be described next.

The operation of the ECL output buffer circuit serving as a normal output buffer will be describe first.

The input signal ENB to the terminal 29 is set at "L" level. As a result, the gate of the n-channel MOS transistor 22 is set at "L" level, and the MOS transistor 22 is turned off. That is, the constant-current source 21 for setting a cutoff state is disconnected from the base of the transistor (emitter follower) 9.

With this operation, the n-channel MOS transistor 34 is turned on/off in accordance with the input signal A to the terminal 28, and a voltage amplitude corresponding to the ECL level is generated by the resistor 37. When this voltage amplitude is transferred to the output buffer circuit main portion 1 via the level converting portion 32, the transistors 5 and 6 of the differential switch 3 are switched, thus obtaining an output signal from the output terminal OUT via the transistor 9.

The operation of the ECL output buffer circuit will be described next, with reference to a case wherein the ECL output buffer circuit is set in a standby state.

In order to output an output signal from one ECL output buffer circuit, selected from a plurality of ECL output buffer circuits, to the bus BUS, the input signal ENB to each ECL output buffer circuit which is not selected and hence is to be set in a standby state is set at "H" level. With this operation, an output from the inverter 35 is set at "L" level, and the n-channel MOS transistor 34 is turned on regardless of the level ("L" or "H" level) of the input signal A.

Consequently, the input IN of the output buffer circuit main portion 1 is set at a potential lower than the reference voltage vref; a current flows from the constant-current source 7 to the transistor 6; and the output terminal OUT is set at "L" level upon a voltage drop due to the resistor 8.

In addition, since the output of the inverter 36 is at "H" level, the n-channel MOS transistor 22 is set in an ON state, and a circuit constituted by the MOS transistor 22 and the constant-current source 21 is connected to the transistor (emitter follower) 9. As a result, an "L"-level potential lower than an "L"-level potential generated by the constant-current source 7 and the resistor 8 by a value corresponding to the effect of the constant-current source 21 is applied to the base of the transistor 22.

That is, the base potential of the transistor 9, set when the transistor 22 is turned on, is set to be lower than the "L" level of the ECL output buffer circuit which is outputting a signal to the bus BUS. Therefore, there is no possibility that large currents flow from ECL output buffer circuits in a standby state, in which no signals are to be transmitted, to the terminating power-supply terminal 11 via the load resistor 10.

With this operation, even if the number of ECL output buffer circuits connected to the bus BUS increases, a base-emitter voltage VBE of the bipolar transistor (emitter follower) of an ECL output buffer circuit which is to transmit a signal does not decrease. Hence, an "L"-level signal output from the ECL output buffer circuit to the bus BUS undergoes no change in level.

FIG. 5 shows an ECL output buffer circuit according to another embodiment of the present invention.

With the recent advance in the micro-patterning techniques for CMOS integrated circuits, in order to ensure the reliability of the gate oxide film of a MOS transistor, the power-supply potential of the CMOS portion tends to be set near 0 V. When such a CMOS technique is to be used, mainly the bipolar portion of an ECL output buffer circuit uses, for example, a power-supply potential of −4.5 V, and a CMOS logic portion 31 uses, for example, a power-supply potential of −1.2 V.

The arrangement of the logic portion 31 will be described below.

The first input terminal of a CMOS NAND gate 33 is connected to a terminal 28 to which an input signal A is supplied. The output terminal of the NAND gate 33 is connected to the gate of an n-channel MOS transistor 34 of a level converting portion 32. The input terminal of a CMOS inverter 35 is connected to an input terminal 29 to which an input signal ENB is supplied.

The output terminal of the inverter 35 is connected to the second input terminal of the CMOS NAND gate 33 and the input terminal of a CMOS inverter 36. The output terminal of the inverter 36 is connected to the gate of a MOS transistor 22.

Note that the power-supply potentials for operating the logic portion 31 include, for example, a potential of −4.5 V applied to a power-supply terminal 12 and a potential of −1.2 V applied to a power-supply terminal 30.

The arrangement of the level converting portion 32 will be described below.

34 is connected to the power-supply terminal 13 via a MOS transistor 42 and a resistor 37. The other terminal (source/drain) of the MOS transistor 34 is connected to the power-supply terminal 12 via a constant-current source 38. The node between the resistor 37 and the transistor 42 is connected to the base of an npn bipolar transistor 39. The collector of the transistor 39 is connected to a ground power supply 13. The emitter of the transistor 39 is connected to the power-supply terminal 12 via a diode 40 and a constant-current source 41. The node between the diode 40 and the constant-current source 41 is connected to the base of a transistor 5 of an output buffer circuit main portion 1.

The arrangement of the output buffer circuit main portion 1 will be described below.

The base of an npn bipolar transistor 6 is connected to a terminal 24. A reference potential Vref is applied to the terminal 24. The emitters of both the transistors 5 and 6 are connected to the power-supply terminal 12 via a constant-current source 7. For example, a potential of −4.5 V is applied to the power-supply terminal 12.

The collector of the transistor 5 is connected to the power-supply terminal 13. For example, a ground potential (0 V) is applied to the power-supply terminal 13. The collector of the transistor 6 is connected to the power-supply terminal 13 via a resistor 8. The base of an npn bipolar transistor 9 constituting an emitter follower 4 is connected to the collector of the transistor 6. The collector of the transistor 9 is connected to the power-supply terminal 13. The emitter of the transistor 9 is connected to an output terminal OUT.

The drain of the MOS transistor 22 is connected to the base of the transistor 9 via a MOS transistor 41A. The source of the MOS transistor 22 is connected to the power-supply terminal 12 via a constant-current source 21. The base of the bipolar transistor 5 and the gate of the MOS transistor 22 are connected to a control circuit 23.

ECL output buffer circuit shown in FIG. 5 has the following characteristics features. First, the two power-supply potentials applied to the CMOS logic portion 31 are set to be −4.5 V and −1.2 V, respectively, so that the difference therebetween is small. Second, the MOS transistor 41A is connected between the bases of the MOS transistor 22 and the bipolar transistor 9, and the MOS transistor 42 is connected between the MOS transistor 34 and the power-supply terminal 13.

Such an arrangement is employed to reduce voltages applied between the gate-drain and gate-source paths of the MOS transistors 22 and 34 because the amplitude of an output from the CMOS logic portion 31 is small. In this manner, different power supplies can be distributed to the CMOS logic portion 31, the level converting portion 32, and the output buffer circuit main portion 1.

The operation of the ECL output buffer circuit shown in FIG. 5 will be described next.

When the ECL output buffer circuit is to operate as a normal output buffer, the input signal ENB to the input terminal 29 is set at "L" level. As a result, the gate of the n-channel MOS transistor 22 is set at "L" level, and the MOS transistor 22 is turned off. That is, the constant-current source 21 for setting a cutoff state is disconnected from the transistor (emitter follower) 9.

With this operation, since the n-channel MOS transistor 34 is turned on/off in accordance with the input signal A to the terminal 28, a voltage amplitude corresponding to the ECL level is generated by the resistor 37. When this voltage amplitude is transferred to the output buffer circuit main portion 1 via the level converting portion 32, the transistors 5 and 6 of the differential switch 3 are switched, thus obtaining an output signal from the output terminal OUT via the transistor 9.

When the ECL output buffer circuit is to be set in a standby state, the input signal ENB is set at "H" level. As a result, the output of the inverter 35 is set at "L" level, and the n-channel MOS transistor 34 is turned on regardless of the level ("L" or "H" level) of the input signal A.

Consequently, the input IN of the output buffer circuit main portion 1 is set at a potential lower than the reference voltage Vref; a current flows from the constant-current source 7 to the transistor 6; and the output terminal OUT is set at "L" level due to a voltage drop across the resistor 8.

Since the output of the inverter 36 is at "H" level, the n-channel MOS transistor 22 is set in an ON state, and a circuit constituted by the MOS transistor 22 and the constant-current source 21 is connected to the transistor (emitter follower) 9. As a result, an "L"-level potential lower than an "L"-level potential generated by the constant-current source 7 and the resistor 8 by a value corresponding to the effect of the constant-current source 21 is applied to the base of the transistor 22.

That is, the base potential of the transistor 9, set when the transistor 22 is turned on, is set to be lower than the "L" level of the ECL output buffer circuit which is outputting a signal to the bus BUS. Therefore, there is no possibility that large currents flow from ECL output buffer circuits in a standby state, in which no signals are to be transmitted, to a terminating power-supply terminal 11 via a resistor 10. With this operation, even if the number of ECL output buffer circuits connected to the bus BUS increases, a base-emitter voltage VBE of the bipolar transistor (emitter follower) of an ECL output buffer circuit which is to transmit a signal does not decrease. Hence, an "L"-level signal output from the ECL output buffer circuit to the bus BUS undergoes no change in level.

In the ECL output buffer circuit shown in FIG. 5, the same effects as those in the ECL output buffer circuit shown in FIG. 4 can be obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An ECL output buffer circuit comprising:
   an output buffer circuit main portion constituted by a differential switch, a first bipolar transistor constituting an emitter follower and having a base to which an output from the differential switch is input, a collector connected to a first power-supply terminal and an emitter connected to an output terminal, and a first MOS transistor including a channel conductive path having one end connected to the base of the first bipolar transistor and the other end connected to a second power-supply terminal via a first constant-current source; and
   a control circuit for receiving a first input signal for determining whether said output buffer circuit main portion is set in a normal operation state or a standby state, for receiving a second input signal for determining an output level of the first bipolar transistor when said output buffer circuit main portion is in a normal operation state, for outputting a first output signal to be input to a gate of the first MOS transistor, and for outputting a second output signal to be input to the differential switch of said output buffer circuit main portion,
   wherein said control circuit sets said first output signal at a first level which turns ON said first MOS transistor and sets said second output signal at a second level which places said first bipolar transistor in a cutoff state, thereby placing said output terminal at a low level when the output buffer circuit main portion is to be set in a standby state, and
   said control circuit sets said first output signal at a third level which turns OFF said first MOS transistor and sets said second output signal at a fourth level which places said first bipolar transistor in an active state thereby placing said output terminal at either said low or high level, when said output buffer circuit main portion is to be set in a normal operation state.

2. A circuit according to claim 1, wherein the differential switch comprises a second bipolar transistor having a base to which the second output signal is input, a collector connected to the first power-supply terminal and an emitter connected to the second power-supply terminal via a second constant-current source, and a third bipolar transistor having a base to which a reference potential is input, a collector connected to the first power-supply terminal via a first resistor and an emitter connected to the second power-supply terminal via the second constant-current source, and an output from the differential switch is obtained from the collector of the third bipolar transistor.

3. A circuit according to claim 2, wherein said control circuit comprises a CMOS logic portion and a CMOS-ECL level converting portion,
   the CMOS logic portion is connected between the first and second power-supply terminals and outputs said first output signal to be input to the gate of the first MOS transistor, and a third output signal to be input to the CMOS-ECL level converting portion,
   the CMOS-ECL level converting portion comprises a second MOS transistor having a gate to which the third output signal is input, a channel conductive path having one end connected to the first power-supply terminal via a second resistor and the other end connected to the second power-supply terminal via a third constant-current source, and a fourth bipolar transistor having a base connected to a node between the second resistor and the second MOS transistor, a collector connected to the first power-supply terminal, and an emitter connected to the second power-supply terminal via a diode and a fourth constant-current source, and
   where the second output signal is obtained from a node between the diode and the fourth constant-current source of the CMOS-ECL level convening portion.

4. A circuit according to claim 3, wherein the CMOS logic portion comprises a first inverter for receiving the first input signal for determining whether said output buffer circuit main portion is set in a normal operation state or a standby state;
   a NAND gate for receiving the second input signal and an output signal from the first inverter, said NAND gate determines the output level of the first bipolar transistor when said output buffer circuit main portion is in a normal operation state, and
   a second inverter for receiving an output signal from the first inverter and outputting the first output signal.

5. A circuit according to claim 2, wherein said control circuit comprises a CMOS logic portion and a CMOS-ECL level converting portion,
   the CMOS logic portion is connected between the third and fourth power-supply terminals, the third and fourth power-supply terminals having a smaller potential difference than the first and second power-supply terminals,
   the CMOS logic portion outputs said first output signal to be input to the gate of the first MOS transistor, and a third output signal to be input to the CMOS-ECL level converting portion,
   the CMOS-ECL level converting portion comprises a second MOS transistor having a gate to which the third output signal is input, a channel conductive path having one end connected to the first power-supply terminal via a second resistor and the other end connected to the second power-supply terminal via a third constant-current source, and a fourth bipolar transistor having a base connected to a node between the second resistor and the second MOS transistor, a collector connected to the first power-supply terminal and an emitter connected to the second power-supply terminal via a diode and a fourth constant-current source,
   where the second output signal is obtained from a node between the diode and the fourth constant-current source of the CMOS-ECL level converting potion.

6. A circuit according to claim 5, further comprising:
a third MOS transistor arranged between one end of the channel conductive path of the first MOS transistor and the base of the first bipolar transistor, and
a fourth MOS transistor arranged between one end of the channel conductive path of the second MOS transistor and the second resistor.

7. A circuit according to claim 5, wherein the CMOS logic portion comprises a first inverter for receiving the first input signal for determining whether said output buffer circuit main portion is set in a normal operation state or a standby state,
a NAND gate for receiving the second input signal and an output signal from the first inverter, said NAND gate determines the output level of the first bipolar transistor when said output buffer circuit main portion is in a normal operation state, and
a second inverter for receiving an output signal from the first inverter, and outputting the first output signal.

8. A circuit according to claim 1, wherein the output terminal is connected to a bus, and the bus is connected to the third power-supply terminal via a load resistor.

9. A circuit according to claim 1, wherein the first and second MOS transistors are n-channel MOS transistors.

* * * * *